(12) United States Patent
Kido et al.

(10) Patent No.: US 8,426,874 B2
(45) Date of Patent: Apr. 23, 2013

(54) LIGHT EMITTING TRANSISTOR

(75) Inventors: Junji Kido, Yamagata (JP); Daigo Aoki, Tokyo (JP)

(73) Assignees: Dai Nippon Printing Co., Ltd., Tokyo-to (JP); Junji Kido, Yonezawa, Yamagata (JP)

( * ) Notice: Subject to any disclaimer, the term of this patent is extended or adjusted under 35 U.S.C. 154(b) by 0 days.

(21) Appl. No.: 12/612,931

(22) Filed: Nov. 5, 2009

(65) Prior Publication Data

US 2010/0051930 A1 Mar. 4, 2010

Related U.S. Application Data

(62) Division of application No. 11/093,675, filed on Mar. 30, 2005, now Pat. No. 7,633,084.

(30) Foreign Application Priority Data

Mar. 31, 2004 (JP) .................................. 2004-106154

(51) Int. Cl.
*H01L 27/15* (2006.01)
*H01L 29/06* (2006.01)
*H01L 33/00* (2010.01)

(52) U.S. Cl.
USPC .................. 257/84; 257/40; 257/98; 257/83; 257/E51.042

(58) Field of Classification Search .................... 257/40, 257/79, 83, 84, 98, E51.042
See application file for complete search history.

(56) References Cited

U.S. PATENT DOCUMENTS

| | | | | |
|---|---|---|---|---|
| 5,356,744 A | * | 10/1994 | Yanus | 430/62 |
| 6,037,718 A | * | 3/2000 | Nagami | 315/169.3 |
| 6,692,845 B2 | * | 2/2004 | Maruyama et al. | 428/690 |
| 6,720,572 B1 | * | 4/2004 | Jackson et al. | 257/40 |
| 6,815,710 B2 | * | 11/2004 | Tsuchida | 257/40 |
| 7,002,176 B2 | * | 2/2006 | Iechi et al. | 257/40 |
| 7,126,153 B2 | * | 10/2006 | Iechi et al. | 257/40 |

FOREIGN PATENT DOCUMENTS

JP 2003-324203 A 11/2003

OTHER PUBLICATIONS

Kazuhiro Kudoh; "Present Situation and Prospect of Organic Transistors", Applied Physics, vol. 72, No. 9, pp. 1151-1156, (2003) No Exact Date Given).
Kazuhiro Kudo, et al; "Fabrication and device characterization of organic light emitting transistors", Thin Solid Films, vol. 438-439, pp. 330-333, Aug. 22, 2003.
British Patent Office Search Report: issued on Jul. 25, 2005.

* cited by examiner

*Primary Examiner* — Shouxiang Hu
(74) *Attorney, Agent, or Firm* — Ladas & Parry LLP

(57) ABSTRACT

A main object of the present invention is to provide a static induction light emitting transistor having an organic EL element structure and a vertical FET structure which is possible to avoid a problem of the shielding of light and a problem of shielding of electric field by a gate electrode. The above object is achieved by providing a light emitting transistor 11 of a vertical FET structure comprising: on a substrate 12; a source electrode 13; a hole transporting layer 14 in which a slit-shaped gate electrode 15 is embedded; an equipotential layer 16; light emitting layer 17; and a transparent or semi-transparent drain electrode 18, provided in this order. In this light emitting transistor, the drain electrode 18 provided on the opposite side of the gate electrode 15, viewing from the light emitting layer 17, is transparent or semitransparent. Therefore, light generated in the light emitting layer 17 can be taken out from the drain electrode side. An electron transporting layer 19 can be provided between the light emitting layer 17 and the drain electrode 18.

7 Claims, 4 Drawing Sheets

PRIOR ART

PRIOR ART

LIGHT EMITTING TRANSISTOR

BACKGROUND OF THE INVENTION

1. Field of the Invention

The present invention relates to a light emitting transistor, more specifically, a static induction light emitting transistor comprising an organic EL element structure and a vertical FET structure.

2. Description of the Related Art

Organic electroluminescence (EL) elements have a simple element structure, and are expected as light emitting elements for next-generation displays, which are thin, light, large-sized and inexpensive. In recent years, research thereon has been actively conducted.

For driving systems for organic EL elements, it is considered that field effect transistors (FETs) of an active matrix driving system which uses thin film transistors (TFTs) are effective in working speed and power consumption. On the other hand, concerning semiconductor materials which constitute thin film transistors, in addition to researches on inorganic semiconductor materials such as silicon semiconductors and compound semiconductors, researches on organic thin film transistors (organic TFTs) using organic semiconductor materials has been actively carried out. Such organic semiconductor materials are expected as next generation semiconductor materials. However, there is a problem that they have a lower charge mobility and a higher resistance than inorganic semiconductor materials.

On the other hand, concerning static induction transistors (SITs) having a vertical FET structure, where the constructions of field effect transistors are made vertical, have advantages as follows: the channel length of the transistors can be made shorter; high-speed response and large electric power are possible since the entire electrodes on the surface can be effectively used; and they are not easily affected by interfaces.

In recent years, making use of the above-described characteristics of the static induction transistor (SIT), investigation has been made on development of a light emitting transistor, wherein this SIT structure and an organic EL element structure are combined (for example, see Japanese Patent Application Laid-Open No. 2003-324203 (claim 1), and "Present Situation and Prospect of Organic Transistors" by Kazuhiro KUDOH, Applied Physics, vol. 72, No. 9, pp 1151-1156 (2003)). FIG. 6 is a sectional structural view showing an example of a light emitting transistor wherein an SIT structure and an organic EL element structure are combined. As shown in FIG. 6, this light emitting transistor 101 has a vertical FET structure comprising: on a glass substrate 102; a source electrode 103 made of a transparent conductive film; a hole transporting layer 104 in which a slit-shaped gate electrode 105 is embedded; a light emitting layer 106; and a drain electrode 107 provided in this order. This composite type light emitting transistor 101 has a structure where the slit-shaped Schottky gate electrode 105 is embedded in the hole transporting layer 104. The hole transporting layer 104 and the gate electrode 105 form Schottky conjugation, thereby forming a depletion layer in the hole transporting layer 104. The expanse of this depletion layer varies due to gate voltage. Thus, by changing the gate voltage, the channel length is controlled. And by changing the current value between the source electrode 103 and the drain electrode 107, switching is attained.

However, the light emitting transistors, wherein an SIT structure and an organic EL element structure are combined, described in the above mentioned JP-A No. 2003-324203 and in "Present Situation and Prospect of Organic Transistors" by Kazuhiro KUDOH, Applied Physics, vol. 72, No. 9, pp 1151-1156 (2003)), have a problem that light emitted from their light emitting layer is shielded by their opaque gate electrode so that the efficiency for taking out the light is deteriorated.

Concerning such a problem, investigation that the emitted light from the light emitting layer 106 is prevented from being shielded by the opaque gate electrode 105 has been made: by making the gate electrode 105 transparent or semitransparent in the light emitting transistor 101 shown in FIG. 6, so as to prevent the shielding of the light; or by providing the slit-shaped gate electrode 105 in an electron transporting layer 108, as shown in a light emitting transistor 111 in FIG. 7.

Although these methods do not cause the problem that light is shielded by the gate electrode 105, the methods have a problem that an electric field is shielded by the gate electrode 105 placed in between the drain electrode 103 and the source electrode 107, so as to generate a shade of the electric field on the light emitting layer 106. This shade of the electric field causes a local deterioration of the light emission of the light emitting layer, so as to deteriorate the light emission efficiency thereof. As a result, these methods have a problem that the efficiency for taking out light is deteriorated.

SUMMARY OF THE INVENTION

The present invention has been made in order to solve the above-mentioned problems, and an object thereof is to provide a static induction light emitting transistor which has an organic EL element structure and a vertical FET structure. Thereby, it is possible to avoid a problem of the shielding of light by a gate electrode, and a problem of the shielding of electric field.

The light emitting transistor of the present invention, which can attain the above-mentioned object, is a light emitting transistor comprising: a source electrode; a drain electrode; a charge transporting layer and a light emitting layer provided between the source electrode and the drain electrode; and a gate electrode provided in the charge transporting layer, wherein the light emitting transistor further comprising an equipotential layer between the gate electrode and the light emitting layer.

In the present invention, in the static induction light emitting transistor having an organic EL element structure and a vertical FET structure, since it comprises the equipotential layer between the gate electrode and the light emitting layer, the following can be prevented: an electric field between the source electrode and the drain electrode is shielded by the gate electrode, so that the shade of the electric field occurs on the light emitting layer. As a result, the electric field is applied evenly to the light emitting layer so that each portion of the light emitting layer emits light evenly. Consequently, the light emitting transistor having a high light emitting efficiency and a high light taking-out efficiency can be obtained.

The light emitting transistor of the present invention is characterized in that, in the above-described light emitting transistor of the present invention, the source electrode or drain electrode placed on the opposite side of the gate electrode, viewing from the light emitting layer, is transparent or semitransparent. By this, since the transparent or semitransparent source electrode or drain electrode is placed on the opposite side of the gate electrode, viewing from the light emitting layer, the light is taken out from the side on which the gate electrode is not provided. As a result, light emitted from the light emitting layer is taken out at high efficiency, without being shielded by the gate electrode, from the side of the transparent or semitransparent source electrode or drain electrode, which is placed on the opposite side of the gate electrode.

The light emitting transistor of the present invention is characterized in that, in the above-described light emitting transistor of the present invention, the equipotential layer has a smaller resistivity than the light emitting layer and the charge transporting layer. By this, since the resistivity of an organic layer (light emitting layer or charge transporting layer) adjacent to the equipotential layer, it is possible to prevent the following: an electric field between the source electrode and the drain electrode is shielded by the gate electrode, so that the shade of the electric field occurs on the light emitting layer. As a result, the electric field is applied evenly to the light emitting layer so that each portion of the light emitting layer emits light evenly. Consequently, light emitting efficiency of each portion of the light emitting layer can be improved.

The light emitting transistor of the present invention is characterized in that, in the above-described light emitting transistor of the present invention, the equipotential layer is a metal layer which reflects light. By this, since the equipotential layer is the metal layer which reflects light, the light emitted from the light emitting layer is reflected by the equipotential layer so that the light is returned to the light emitting layer side. For this reason, the light is taken out from the opposite side of the gate electrode, viewing from the light emitting layer. Therefore, by making the source electrode or the drain electrode placed on this side transparent or semitransparent, the light-taking-out efficiency can be further improved.

The light emitting transistor of the present invention is characterized in that, in the above-described light emitting transistor of the present invention, the equipotential layer is a charge transfer complex compound layer. In this invention, the charge transfer complex compound functions as the equipotential layer. Therefore, occurrence of the shade of the electric field, due to the shielding of the electric field between the source electrode and the drain electrode by the gate electrode, can be prevented.

The light emitting transistor of the present invention is characterized in that, in the above-described light emitting transistor of the present invention, comprising a charge injecting layer between the equipotential layer and the light emitting layer. By this, since it comprises the charge injecting layer between the equipotential layer and the light emitting layer, there is an effect that the charge injecting efficiency into the light emitting layer is improved.

The light emitting transistor of the present invention is characterized in that, in the above-described light emitting transistor of the present invention, comprising a charge injecting layer between the source electrode or drain electrode and the charge transporting layer. By, this, since it comprises the charge injecting layer between the source electrode or drain electrode and the charge transporting layer, it is possible to perform the injection of charges easily from the source electrode or drain electrode to the charge transporting layer.

The light emitting transistor of the present invention is characterized in that, in the above-described light emitting transistor of the present invention, the charge transporting layer, in which the gate electrode is provided, is a hole transporting layer, and the drain electrode is transparent or semitransparent. By this, since the charge transporting layer, in which the gate electrode is provided, is a hole transporting layer, and the drain electrode is transparent or semitransparent, it is possible to provide a top emission type light emitting transistor.

The light emitting transistor of the present invention is characterized in that, in the above-described light emitting transistor of the present invention, at least the charge transporting layer and the light emitting layer are layers mainly composed of an organic material. By this, since at least the charge transporting layer and the light emitting layer mainly composed of an organic material, it is possible to form many layers therein by coating or printing. Thus, the light emitting transistor can be rendered a light emitting transistor excellent in productivity and low in costs. The wording "at least" is incorporated because it is preferable that also the charge injecting layer or the equipotential layer, which constitutes the light emitting transistor of the present invention, is a layer mainly composed of an organic material.

As described above, according to the static induction light emitting transistor of the present invention, which has an organic EL element structure and a vertical FET structure, it is possible to prevent the occurrence of the electric field shadow on the light emitting layer due to the electric field between the source electrode and the drain electrode being shielded by the gate electrode. Therefore, the electric field is applied evenly to the light emitting layer, so that each portion of the light emitting layer can emit light evenly. As a result, according to the present invention, a light emitting transistor having a high light emitting efficiency and a high light-taking-out efficiency can be provided.

BEST MODES FOR CARRYING OUT THE INVENTION

Figure 1:
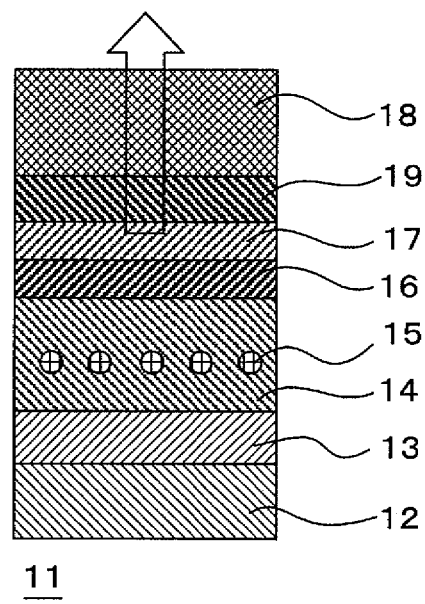
FIG. 1 is a sectional structure view of a first embodiment of the light emitting transistor of the present invention.

Referring to the drawings, the light emitting transistor of the present invention is described hereinafter.

The light emitting transistor of the present invention is a static induction light emitting transistor having an organic EL element structure and a vertical FET structure. The transistor comprises: a source electrode; a drain electrode; a charge transporting layer and a light emitting layer provided between the source electrode and the drain electrode; and a gate electrode provided in the charge transporting layer, and further comprises an equipotential layer between the gate electrode and the light emitting layer. This composite type light emitting transistor has a structure wherein a slit-shaped Schottky gate electrode (corresponding to the grid of a triode) is embedded in the charge transporting layer. The charge transporting layer and the gate electrode form Schottky conjugation, thereby forming a depletion layer in the charge transporting layer. The expanse of this depletion layer is changed by gate voltage applied to the gate electrode. Thus, by changing the gate voltage, the channel length is controlled. And by changing the value of electric current (i.e., carrier flow) between the source electrode and the drain electrode, switching is attained. If the light emitting transistor of the present invention does not have this gate electrode, this transistor has the same structure as conventional organic EL elements.

FIG. 1 is a schematic structural view showing a first embodiment of the light emitting transistor of the present invention. The light emitting transistor 11 of the present invention, shown in FIG. 1, has a vertical FET structure comprising: on a substrate 12; a source electrode 13; a hole transporting layer 14 wherein a slit-shaped gate electrode 15 is embedded; an equipotential layer 16; a light emitting layer 17; and a transparent or semitransparent drain electrode 18, provided in this order. The light emitting transistor 11 according to the first embodiment is a light emitting transistor of a top emission type, and light generated in the light emitting layer 17 is taken out from the drain electrode side. In the top emission type light emitting transistor, wherein the gate electrode 15 is provided in the hole transporting layer 14 and is present on the substrate 12 side viewing from the light emitting layer 17, an electron transporting layer 19 provided between the light emitting layer 17 and the drain electrode 18 is an optional layer. Thus, the electron transporting layer 19 may be provided as shown in FIG. 1, however, it is not necessary to be provided.

Figure 2:
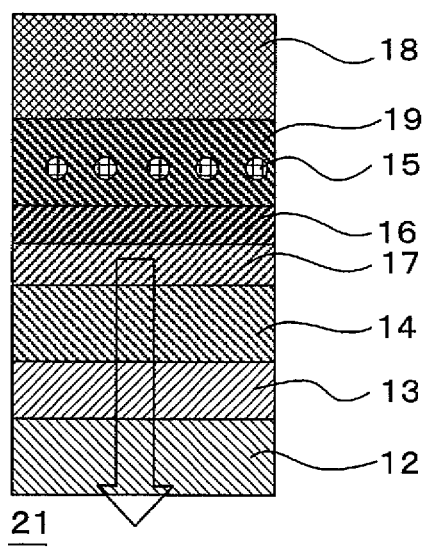
FIG. 2 is a sectional structure view of a second embodiment of the light emitting transistor of the present invention.

FIG. 2 is a schematic structural view showing a second embodiment of the light emitting transistor of the present invention. The light emitting transistor 21 of the present invention, shown in FIG. 2, has a vertical FET structure comprising: on a transparent substrate 12; a transparent or semitransparent source electrode 13; a hole transporting layer 14; a light emitting layer 17; an equipotential layer 16; an electron transporting layer 19 wherein a slit-shaped gate electrode 15 is embedded; and a drain electrode 18, provided in this order. The light emitting transistor 21 according to the second embodiment is a light emitting transistor of a bottom emission type, and light generated in the light emitting layer 17 is taken out from the source electrode side.

Each of the sectional structural views shown in FIGS. 1 and 2 and the sectional structural views showing below-described other embodiments shows one pixel of a light emitting transistor. Accordingly, a color display can be formed by forming light emitting layers, which emits light of a predetermined color, per every pixel.

(Structure of Light Emitting Transistor)

The following describes each layer and each electrode which constitute the light emitting transistor of the present invention, referring to the first and second embodiments as examples.

<Substrate>

The substrate 12 is not particularly limited as long as it is generally used as a substrate of an organic EL element, that is, those support an organic EL element in its strength. Thus, the substrate 12 may be selected from various kinds of things. Flexible materials, hard materials or the like is selected for the material of the substrate, depending on its application. Specific examples of the material which can be used include glass, quartz, polyethylene, polypropylene, polyethylene terephthalate, polymethacrylate, polymethyl methacrylate, polymethyl acrylate, polyester, polycarbonate and the like. As shown in FIG. 2, when the light emitted from the light emitting layer 17 permeates through this substrate 12 so as to be taken out, these materials of the substrate need to be transparent such as glass. On the other hand, as shown in FIG. 1, when the light emitted from the light emitting layer 17 is taken out from the opposite side of the substrate 12, this substrate 12 is not limited to transparent materials. The shape of the substrate 12 may be a sheet-like-shape or, it may be in a continuous form. Specific examples of the shape include shapes like card, film, disk, chip and the like.

<Electrode>

The electrodes which constitute the light emitting transistor of the present invention are the source electrode 13, the gate electrode 15 and the drain electrode 18. As shown in FIGS. 1 and 2, generally: the source electrode 13 is provided on the substrate 12; the gate electrode 15 is provided so as to be embedded in the charge transporting layer (hole transporting layer 14 or the electron transporting layer 19); and the drain electrode 18 is provided at a place opposing to the source electrode 13, in such a manner that the organic EL element structure is sandwiched therebetween. As electrode material, a thin film made of a metal, a conductive oxide, a conductive polymer or the like is used. In FIGS. 1 and 2, the source electrode 13 is provided on the substrate 12 as an anode constituting the organic EL element structure, and the drain electrode 18 is placed at place opposing to the source electrode 13, as a cathode constituting the organic EL element structure. However, the positions of the above can be reversed.

When the source electrode 13 is formed as the anode constituting the organic EL element structure, examples of the material thereof include: transparent conductive films such as ITO (indium tin oxide), indium oxide, IZO (indium zinc oxide), $SnO_2$ ZnO and the like; metals having a large work function such as gold and chromium; and conductive polymers such as polyaniline, polyacetylene, polyalkylthiophene derivatives, and polysilane derivatives. On the other hand, when the drain electrode 18 is formed as the cathode constituting the organic EL element structure, materials such as a metal having a small work function such as: simple metals such as aluminum and silver; magnesium alloys such as MgAg; aluminum alloys such as AlLi, AlCa and AlMg; alkali metals such as Li and Ca; and alloys of the alkali metals. As materials when it is formed as the gate electrode 15, examples thereof include a metal which forms a Schottky barrier together with the material constituting the charge transporting layer, and also, is the same electrode as used in the source electrode or the drain electrode.

When the source electrode 13 or the drain electrode 18 is placed on the opposite side of the gate electrode 15, viewing from the light emitting layer 17, it is preferable that the source electrode 13 or the drain electrode 18 placed at such a position is transparent or semitransparent. By this structure, the light is taken out from the side on which the gate electrode 15 is not formed, viewing from the light emitting layer 17. Therefore, light generated in the light emitting layer 17 is taken out at a high efficiency from the side of the transparent or semitransparent source electrode 13 or drain electrode 18 placed on the opposite side of the gate electrode 15, without being shielded by the gate electrode 15. As the transparent or semitransparent electrode, a transparent conductive film such as ITO (indium tin oxide), indium oxide, IZO (indium zinc oxide), $SnO_2$, and ZnO is preferably used.

Each of the above-mentioned electrodes is formed by a vacuum process such as vacuum deposition, sputtering or CVD, or by coating. The film thickness thereof varies depending on the used material or the like. For example, it is preferably in a range about 10 to 1000 nm.

When the electrode is formed on the organic layer such as the light emitting layer, the charge transporting layer or the like, a protective layer may be provided on the organic layer in order to reduce damages to the organic layer while the electrode is formed.

<Organic EL Element Structure>

In the light emitting transistor of the present invention, between the source electrode 13 and the drain electrode 18, an organic EL element structure, comprising at least: the charge transporting layer (hole transporting layer 14 or electron transporting layer 19), wherein the gate electrode 15 is embedded; and the light emitting layer, is provided. This organic EL element structure may be an element structure provided with the hole transporting layer 14, the light emitting layer 17 and the electron transporting layer 19 in this order from the substrate side, as shown in FIGS. 1 and 2. However, the positions of the above can be reversed. Moreover, as will be described later, the organic EL element structure may be an element structure further provided with a charge injecting layer such as a hole injecting layer or an electron injecting layer. As other layers, a charge blocking layer, such as a hole blocking layer or an electron blocking layer, for preventing the carriers (hole or electron) from going through and for recombining the carries efficiently may be provided.

In the light emitting transistor of the present invention, it is preferable to provide a charge injecting layer: between the source electrode 13 or drain electrode 18 and the charge transporting layer (hole transporting layer 14 or electron transporting layer 19); or between the light emitting layer and the equipotential layer. When this charge injecting layer is adjacent to the hole transporting layer 14, it is a hole injecting layer. And when this charge injecting layer is adjacent to the electron transporting layer 19, it is an electron injecting layer. In either case the charge injecting layer acts to facilitate the charge injection from the electrode into the charge transporting layer.

Each of these organic layers is formed into an appropriate film thickness (for example in a range of 0.1 nm to 10 μm) in accordance with the construction, constituting materials or the like of the organic EL element. If the film thickness of each organic layer is too large, a large applying voltage is required to obtain a certain optical output. Thus, the light emitting efficiency may be deteriorated. If the film thickness of each organic layer is too small, pinholes or the like may be generated. Thus, a sufficient light emitting brightness may not be obtained even if an electric field is applied.

The material for forming the light emitting layer 6 is not particularly limited as long as the material is generally used as the light emitting layer of the organic EL elements. Examples thereof include dye based light emitting material, metal complex based light emitting material, polymer based light emitting material and the like.

Examples of the dye based light emitting material include cyclopentadiene derivatives, tetraphenylbutadiene derivatives, triphenylamine derivatives, oxadiazole derivatives, pyrazoloquinoline derivatives, distyrylbenzene derivatives, distyrylarylene derivatives, silole derivatives, thiophene ring compounds, pyridine ring compounds, perynone derivatives, perylene derivatives, oligo-thiophene derivatives, oxadiazole dimer, and pyrazoline dimer.

Examples of the metal complex based light emitting material include metal complexes having Al, Zn, Be or the like, or a rare earth metal such as Tb, Eu or Dy as a central metal, and having oxadiazole, thiadiazole, phenylpyridine, phenylbenzoimidazole, quinoline structure or the like as a ligand. Specific examples thereof include an aluminum quinolinol complex, a benzoquinolinol beryllium complex, a benzoxazole zinc complex, a benzothiazole zinc complex, an azomethyl zinc complex, a porphyrin zinc complex, a europium complex and the like.

Examples of the polymer based light emitting material include poly-p-phenylene vinylene derivatives, polythiophene derivatives, poly-p-phenylene derivatives, polysilane derivatives, polyacetylene derivatives, polyvinyl carbazole, polyfluorenone derivatives, polyfluorene derivatives, polyquinoxaline derivatives, copolymers thereof and the like.

Additives such as a doping agent may be added to the light emitting layer in order to improve the light emitting efficiency thereof, change the emission wavelength and the like. Examples of the doping agent include perylene derivatives, coumalin derivatives, rubrene derivatives, quinacridon derivatives, squalirium derivatives, porphyrin derivatives, styryl dyes, tetracene derivatives, pyrazoline derivatives, decacyclene, phenoxazone, quinoxaline derivatives, carbazole derivatives, fluorene derivatives and the like.

Examples of the material for forming the hole injecting layer include, as well as the compounds exemplified as the examples of the light emitting material of the light emitting layer: oxides such as phenylamine based, star-burst type amine based, phthalocyanine based, vanadium oxide, molybdenum oxide, ruthenium oxide and aluminum oxide; derivatives such as amorphous carbon, polyaniline, and polythiophene.

Examples of the material for forming the electron injecting layer include, as well as the compounds exemplified as the examples of the light emitting material of the light emitting layer: alkali metals, halides of alkali metals, and organic complexes of alkali metals and the like can be listed, such as, aluminum, lithium fluoride, strontium, magnesium oxide, magnesium fluoride, strontium fluoride, calcium fluoride, barium fluoride, aluminum oxide, strontium oxide, calcium, polymethyl methacrylate sodium polystyrenesulfonate, lithium, cesium, cesium fluoride and the like.

If necessary, a light emitting material or charge transporting/injecting material of an oligomer material or dendrimer material may be included in the above-mentioned organic layers such as the light emitting layer or charge transporting layer.

Each of the above-mentioned organic layers is formed: by vacuum evaporation; or by preparing a coating solution by dissolving or dispersing each forming material in a solvent such as toluene, chloroform, dichloromethane, tetrahydrofuran or dioxane, and then, coating or printing the coating solution using an coating apparatus or the like.

<Equipotential Layer>

The equipotential layer 16 is a component characterizing the light emitting transistor of the present invention, and is provided between the gate electrode 15 and the light emitting layer 17. This equipotential layer 16 may be formed into any form as long as the equipotential layer 16 satisfies the requirement that the resistivity thereof is smaller than the organic layers adjacent thereto. In the light emitting transistor of the present invention, because of this equipotential layer 16, it possible to prevent the occurrence of a shade of electric field on the light emitting layer 17, due to the electric field between the source electrode 13 and the drain electrode 18 being shielded by the gate electrode 15. As a result, the electric field is applied evenly to the light emitting layer 17 so that each portion of the light emitting layer 17 emits light evenly. Consequently, the light emitting efficiencies of each portion of the light emitting layer 17 can be improved.

It is preferable that the equipotential layer 16 is formed of a material having a high charge injecting efficiency from the charge transporting layer, and simultaneously, having a high charge injecting efficiency into the light emitting layer. From such a viewpoint, it is preferable to provided the charge injecting layer between the equipotential layer 16 and the light emitting layer 17.

The equipotential layer 16 may be formed of any kinds of material as long as the material has a smaller resistivity than the organic layers adjacent to the equipotential layer. The resistivity of the equipotential layer is, meeting the above-mentioned requirements, preferably in a range of $10^{12}$ to $10^{-7}$ Ωm, more preferably in a range of $10^8$ to $10^{-6}$ Ωm. If the resistivity of the equipotential layer is too high, potential unevenness may be caused. If it is too low, crosstalk with adjacent pixels may be caused. Specific examples of the material for forming the equipotential layer include conductive inorganic compounds such as Al, Ag, Au, Cr ITO (indium tin oxide), $SnO_2$, ZnO, $TiO_2$, ZnS, ZnSe TiN, InN, GaN, $RuO_2$, $SrCu_2O_2$, $CuAlO_2$ and the like.

The equipotential layer 16 is preferably a layer of a light-reflective type, which is capable of reflecting light emitted from the light emitting layer 17 toward the transparent or semitransparent electrode side. Preferably, the layer 16 is, for example, a metal layer of Al, Ag, Au, Cr or the like. By providing the equipotential layer, the light emitted from the light emitting layer is reflected on this equipotential layer so as to be returned toward the light emitting layer side. Therefore, when the light is taken out from the opposite side of the gate electrode, viewing from the light emitting layer, and the source electrode or drain electrode placed on this side is transparent or semitransparent, the light emitting efficiency can be further improved. Even if the equipotential layer is a transparent or semitransparent layer which has a high transmittance, the light emitting efficiency can be improved by making the source electrode or drain electrode placed on the gate electrode side, viewing from the light emitting layer, a layer of a light-reflective type as described above.

The equipotential layer 16 may be a charge transfer complex compound layer. With the equipotential layer formed of such an organic thin film, as long as the equipotential layer 16 satisfies the requirement that the resistivity thereof is smaller than the organic layers adjacent thereto, it possible to prevent the occurrence of a shade of electric field on the light emitting layer, due to the electric field between the source electrode and the drain electrode being shielded by the gate electrode. This charge transfer complex compound layer is a thin film formed of a charge transfer complex compound which is a mixture of a donor and an acceptor. Examples of the donor include amine compounds, alkali metals, alkaline earth metals, and rare earth metals. Examples of the acceptor include: inorganic compounds such as $V_2O_5$, $Re_2O_7$, ferric chloride, ferric bromide, aluminum chloride, aluminum iodide, gallium chloride and the like; and organic compounds such as DDQ (dicyclodicyanobenzene), TNF (trinitrofluorenone), TCNQ (tetracyanoquinodimethane), 4F-TCNQ (tetrafluorotetracyanoquinodimethane) and the like. The charge transfer complex compound layer contains at least one kind of these donor and acceptor.

The equipotential layer may be composed of plural layers, for example, combining: a metal having good injecting efficiency from the charge transporting layer; and a metal having good injecting efficiency into the light emitting layer. In this case, the combination may be: a combination of an organic layer with an organic layer; a combination of an inorganic layer with an inorganic layer; or a combination of an organic layer with an inorganic layer.

Other Preferred Embodiments

The light emitting transistor of the present invention, there are other preferred structures described below, as well as the first or second embodiment as shown in FIG. 1 or 2, respectively.

Figure 3A:
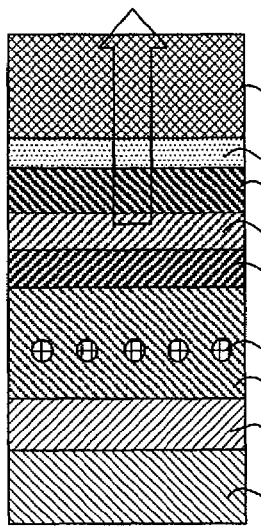
FIGS. 3A to 3C are sectional structural views showing each example of the light emitting transistor of the present invention having an electron injecting layer.
Figure 3B:
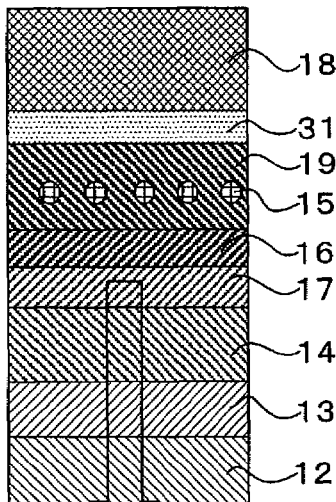
Figure 3C:
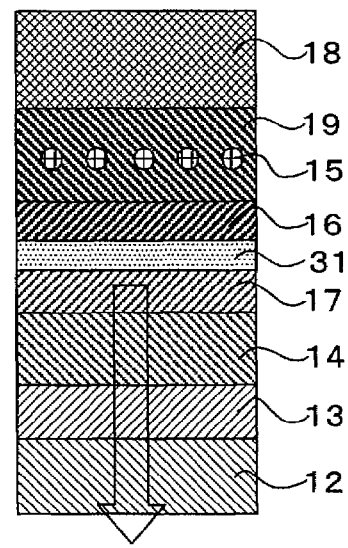

FIGS. 3A to 3C are sectional structural views each showing an example of the light emitting transistor of the present invention having an electron injecting layer 31. FIG. 3A shows an embodiment wherein the electron injecting layer 31 is provided between the light emitting layer 17 (or the electron transporting layer 19) and the drain electrode 18 in the first embodiment shown in FIG. 1. FIG. 3B shows an embodiment wherein the electron injecting layer 31 is provided between the electron transporting layer 19 and the drain electrode 18 in the second embodiment shown in FIG. 2. FIG. 3C shows an embodiment wherein the electron injecting layer 31 is provided between the light emitting layer 17 and the equipotential layer 16 in the second embodiment shown in FIG. 2. The function and the forming material of this electron injecting layer are as described above.

Figure 4A:
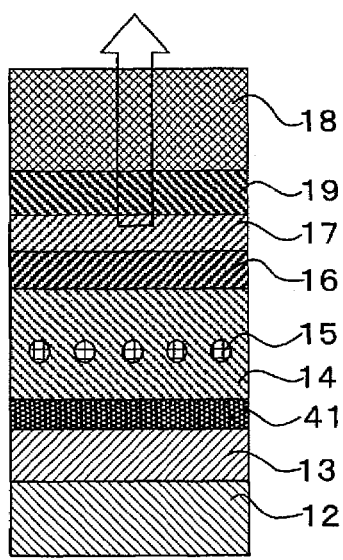
FIGS. 4A to 4C are sectional structural views showing each example of the light emitting transistor of the present invention having a hole injecting layer.
Figure 4B:
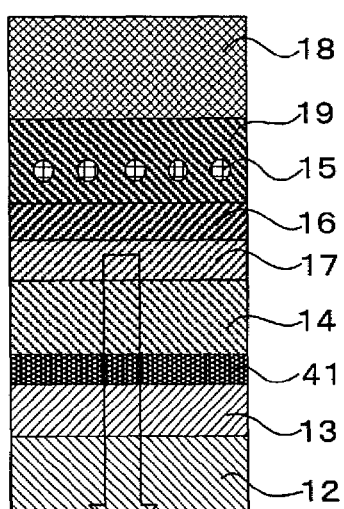
Figure 4C:
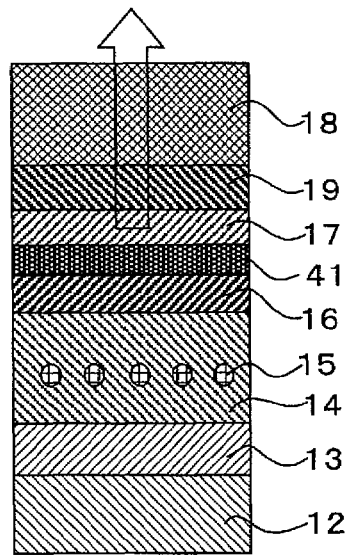

FIGS. 4A to 4C are sectional structural views each showing an example of the light emitting transistor of the present invention having a hole injecting layer 41. FIG. 4A shows an embodiment wherein the hole injecting layer 41 is provided between the source electrode 13 and the hole transporting layer 14 in the first embodiment shown in FIG. 1. FIG. 4B shows an embodiment wherein the hole injecting layer 41 is provided between the source electrode 13 and the hole transporting layer 14 in the second embodiment shown in FIG. 2. FIG. 4C shows an embodiment wherein the hole injecting layer 41 is provided between the equipotential layer 16 and the light emitting layer 17 in the first embodiment shown in FIG. 1. The function and the forming material of this hole injecting layer are as described above.

Figure 5:
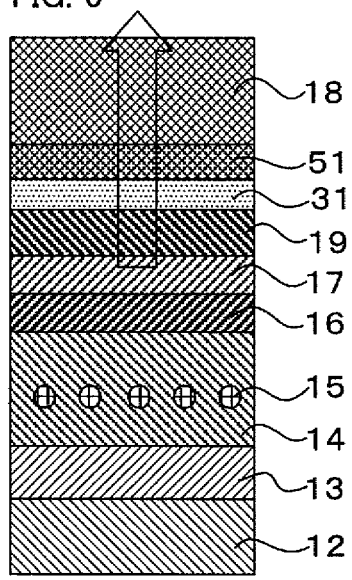
FIG. 5 is a sectional structural view showing an example of the light emitting transistor of the present invention having a protective layer 51.
Figure 6:
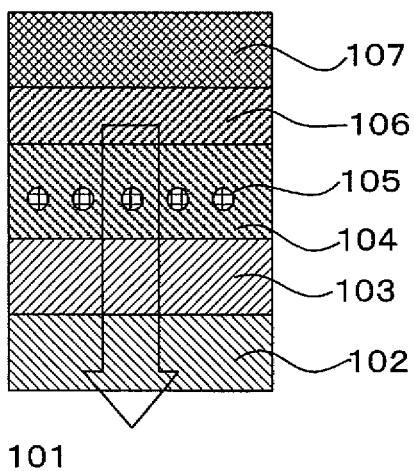
FIG. 6 is a sectional structural view showing an example of a conventional light emitting transistor, wherein an SIT structure and an organic EL element structure are combined.
Figure 7:
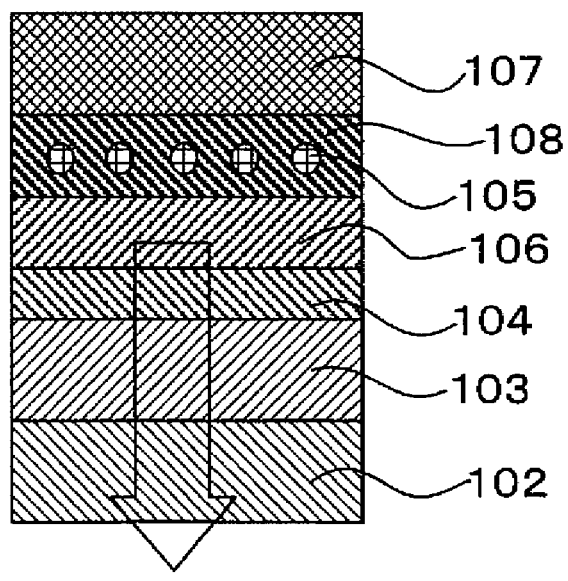
FIG. 7 is a sectional structural view sowing another example of a conventional light emitting transistor, wherein an SIT structure and an organic EL element structure are combined.

FIG. 5 is a sectional structural view showing an example of the light emitting transistor of the present invention having a protective layer 51. This light emitting transistor is an embodiment wherein the protective layer 51 is provided between the electron injecting layer 31 and the drain electrode 18 in the light emitting transistor shown in FIG. 3A. When an electrode is formed into a film on the organic layers, such as the light emitting layer, the charge transporting layer and the electron injecting layer, by sputtering method or the like, the protective layer 51 is provided in advance to the formation of the electrode. By providing this protective layer 51, it is possible to reduce damages to the organic layers when the electrode is formed. The protective layer 51 is formed into a film of about 10 to 100 nm thickness, by vacuum deposition or sputtering, using materials such as a semitransparent film of Au, Ag, Al or the like, or an inorganic semiconductor film of ZnS, ZnSe or the like.

As described above, in the light emitting transistor of the present invention, at least its charge transporting layer and light emitting layer are formed of layers mainly comprising organic materials. Therefore, many of the layers constituting the light emitting transistor can be formed by coating or printing. Thus, the light emitting transistor is excellent in productivity and low in costs.

(Production of Light Emitting Transistor)

The following describes a process for producing the light emitting transistor of the present invention. In particular, a process for producing the light emitting transistor having an embodiment as shown in FIGS. 1 and 2 will be described, using the coating method, capable of reducing costs and making the area of a film large, as frequently as possible.

First, the source electrode is formed on the glass substrate. The source electrode needs to be transparent or semitransparent, as shown in FIGS. 1 and 2, according to the embodiments. When the transparent or semitransparent source electrode is formed, an ITO (indium tin oxide) film, which is a transparent conductive film, is formed. This ITO film can be formed by film forming methods such as sputtering, vacuum deposition or the like, or it can be formed by coating an ITO film forming coating solution, or some other process. The ITO film formed on the glass substrate is patterned into the source electrode in the form of stripes by, for example, photolithographic technique.

Next, as an organic material for hole transporting layer, for example, a conductive polymer composed of poly(ethylenedioxythiophene) (PEDTO) and poly(styrenesulfonate) (PSS) is coated onto the source electrode, so as to form the hole transporting layer. Next, the gate electrode of an Al semitransparent film is formed by vacuum deposition or the like. This gate electrode is formed into a slit-shape, by using a mask, by vacuum deposition. Furthermore, the hole transporting layer is coated onto the gate electrode, so as to form the hole transporting layer, in which the gate electrode is embedded.

Next, the equipotential layer of, for example, Au is formed on the hole transporting layer by vacuum deposition or the like. The light emitting layer of polyphenylene vinylene is formed on this equipotential layer by spin coating. Furthermore, the electron transporting layer of Ca is formed on this light emitting layer by vacuum deposition. In particular, when a color element is formed, the light emitting layer form of different light emitting materials is formed per each pixel. Therefore, for example, light emitting layer materials of red, green and blue are discharged from nozzles, so as to form each pixel.

After forming the organic EL element structure as described above, the ITO (indium thin oxide) film, which is a transparent conductive film, is formed as the drain electrode. This ITO film can be formed by film forming methods such as sputtering, vacuum deposition or the like, or it can be formed by coating an ITO film forming coating solution, or some other process. Preferably, the protective layer formed of ZnSe is formed by vacuum deposition before the formation of the drain electrode.

In the obtained light emitting transistor, the resistivity of the equipotential layer formed of Au was $1 \times 10^{-6}$ $\Omega$cm according to measurement by a four-terminal method. The resistivity of the hole transporting layer, composed of PEDOT: PSS, constituting an adjacent lower layer of the equipotential layer, was $1 \times 10^5$ $\Omega$cm according to the two-terminal method. The resistivity of the light emitting layer, formed of polyphenylene vinylene, constituting an adjacent upper layer of the equipotential layer, was $1 \times 10^{13}$ $\Omega$cm. In this way, the equipotential layer has lower resistivity than the organic layers adjacent thereto. By this equipotential layer, it is possible to prevent the occurrence of electric field shade on the light emitting layer, due to the electric field between the source electrode and the drain electrode being shielded by the gate electrode. As a result, the electric field is applied evenly to the light emitting layer, so that each portion of the light emitting layer emits light evenly. Consequently, the light emitting efficiencies of each portion of the light emitting layer can be improved.

In the light emitting transistor of the present invention, which is produced by the methods as described above, each organic layer, which is mainly formed of organic materials, is formed by coating. Therefore, the area thereof can be made larger and costs thereof can be decreased.

What is claimed is:

1. A light emitting transistor comprising: a source electrode; a drain electrode; a charge transporting layer and a light emitting layer provided between the source electrode and the drain electrode; and a gate electrode provided in the charge transporting layer,
    wherein the light emitting transistor further comprising an equipotential layer between the gate electrode and the light emitting layer, and a charge injecting layer between the equipotential layer and the light emitting layer,
    wherein the equipotential layer has a smaller resistivity than the light emitting layer, and the charge transporting layer,
    wherein the resistivity of the equipotential layer is in a range of $10^{12}$ to $10^{-7}$ $\Omega$m, and
    wherein switching is attained by changing a gate voltage applied to the gate electrode and thereby changing a value of electric current between the source electrode and the drain electrode.

2. The light emitting transistor according to claim 1, wherein the source electrode or drain electrode placed on the opposite side of the gate electrode, viewing from the light emitting layer, is transparent or semitransparent.

3. The light emitting transistor according to claim 1, wherein the equipotential layer is a metal layer which reflects light.

4. The light emitting transistor according to claim 1, wherein the equipotential layer is a charge transfer complex compound layer.

5. The light emitting transistor according to claim 1, comprising a charge injecting layer between the source electrode or drain electrode and the charge transporting layer.

6. The light emitting transistor according to claim 1, wherein the charge transporting layer, in which the gate electrode is provided, is a hole transporting layer, and
    the drain electrode is transparent or semitransparent.

7. The light emitting transistor according to claim 1, wherein at least the charge transporting layer and the light emitting layer are layers mainly composed of an organic material.

* * * * *